(12) United States Patent
Choudhury et al.

(10) Patent No.: US 11,090,768 B2
(45) Date of Patent: Aug. 17, 2021

(54) LEAD-FREE AND ANTIMONY-FREE TIN SOLDER RELIABLE AT HIGH TEMPERATURES

(71) Applicant: ALPHA ASSEMBLY SOLUTIONS INC., Somerset, NJ (US)

(72) Inventors: Pritha Choudhury, Bangalore (IN); Morgana De Avila Ribas, Bangalore (IN); Sutapa Mukherjee, Bangalore (IN); Anil Kumar, Bangalore (IN); Siuli Sarkar, Bangalore (IN); Ranjit Pandher, Plainsboro, NJ (US); Ravi Bhatkal, South Plainfield, NJ (US); Bawa Singh, Voorhees, NJ (US)

(73) Assignee: ALPHA ASSEMBLY SOLUTIONS INC., Somerset, NJ (US)

( * ) Notice: Subject to any disclaimer, the term of this patent is extended or adjusted under 35 U.S.C. 154(b) by 404 days.

(21) Appl. No.: 14/698,450

(22) Filed: Apr. 28, 2015

(65) Prior Publication Data
US 2015/0224604 A1 Aug. 13, 2015

Related U.S. Application Data

(63) Continuation of application No. 14/434,470, filed as application No. PCT/GB2013/052624 on Oct. 9, 2013, now abandoned.

(Continued)

(51) Int. Cl.
*B23K 1/00* (2006.01)
*B23K 1/19* (2006.01)
(Continued)

(52) U.S. Cl.
CPC .............. *B23K 35/262* (2013.01); *B23K 1/00* (2013.01); *B23K 1/002* (2013.01); *B23K 1/0016* (2013.01);
(Continued)

(58) Field of Classification Search
CPC .............. B23K 35/262; B23K 35/0227; B23K 35/0233; B23K 35/0244; B23K 35/025;
(Continued)

(56) References Cited

U.S. PATENT DOCUMENTS 6,319,461 B1 * 11/2001 Domi .................. B23K 35/262
148/400
6,365,097 B1 4/2002 Yamashita et al.
(Continued)

FOREIGN PATENT DOCUMENTS

CN 1392817 A 1/2003
CN 101072886 11/2007
(Continued)

OTHER PUBLICATIONS

International Search Report, PCT/GB2013/052624, dated Dec. 13, 2013, 4 pages.
(Continued)

*Primary Examiner* — Brian D Walck
(74) *Attorney, Agent, or Firm* — Carmody Torrance Sandak & Hennessey LLP

(57) ABSTRACT

A lead-free, antimony-free tin solder which is reliable at high temperatures and comprises up to 10 wt % Ag, up to 10 wt % Bi, up to 3 wt % Cu, other optional additives, balance tin, and unavoidable impurities.

16 Claims, 9 Drawing Sheets

(a)

(b)

Related U.S. Application Data

(60) Provisional application No. 61/711,277, filed on Oct. 9, 2012.

(51) Int. Cl.

| | | |
|---|---|---|
| *C22C 13/00* | (2006.01) | |
| *C22C 13/02* | (2006.01) | |
| *B23K 35/26* | (2006.01) | |
| *H05K 3/34* | (2006.01) | |
| *B23K 35/02* | (2006.01) | |
| *B23K 1/012* | (2006.01) | |
| *B23K 1/08* | (2006.01) | |
| *B23K 1/002* | (2006.01) | |
| *B23K 1/005* | (2006.01) | |
| *B23K 1/20* | (2006.01) | |
| *B23K 103/12* | (2006.01) | |

(52) U.S. Cl.
CPC ............ *B23K 1/0056* (2013.01); *B23K 1/012* (2013.01); *B23K 1/085* (2013.01); *B23K 1/19* (2013.01); *B23K 1/203* (2013.01); *B23K 35/025* (2013.01); *B23K 35/0222* (2013.01); *B23K 35/0227* (2013.01); *B23K 35/0233* (2013.01); *B23K 35/0244* (2013.01); *C22C 13/00* (2013.01); *C22C 13/02* (2013.01); *H05K 3/3457* (2013.01); *H05K 3/3463* (2013.01); *B23K 2103/12* (2018.08); *Y10T 403/479* (2015.01)

(58) Field of Classification Search
CPC ........ B23K 1/00; B23K 1/0016; B23K 1/203; C22C 13/00; C22C 13/02; H05K 3/3457; H05K 3/3463
USPC .............. 148/23, 24; 403/272; 420/560, 561
See application file for complete search history.

(56) References Cited

U.S. PATENT DOCUMENTS

| | | |
|---|---|---|
| 8,845,826 B2 | 9/2014 | Kawamata et al. |
| 2002/0051728 A1 | 5/2002 | Sato et al. |
| 2003/0015575 A1 | 1/2003 | Yamaguchi et al. |
| 2007/0134125 A1 | 6/2007 | Liu et al. |
| 2007/0295528 A1 | 12/2007 | Nishi et al. |
| 2008/0292492 A1 | 11/2008 | Ingham et al. |
| 2010/0116376 A1* | 5/2010 | Huang ................ B23K 35/262 148/24 |
| 2010/0307823 A1 | 12/2010 | Kawamata et al. |
| 2014/0328719 A1 | 11/2014 | Chen |
| 2015/0266137 A1 | 9/2015 | Choudhury et al. |

FOREIGN PATENT DOCUMENTS

| | | |
|---|---|---|
| CN | 101096730 A | 1/2008 |
| CN | 101214588 A1 | 7/2008 |
| JP | 10034376 A | 2/1998 |
| JP | 2000015476 A | 1/2000 |
| JP | 2000-288772 | 10/2000 |
| JP | 2000280090 A | 10/2000 |
| JP | 2002096191 | 4/2002 |
| JP | 2002224881 A | 8/2002 |
| JP | 2003126987 A | 5/2003 |
| JP | 2005153007 A | 6/2005 |
| JP | 2006061914 A | 3/2006 |
| JP | 2008031550 A | 2/2008 |
| JP | 2011005510 A | 1/2011 |
| JP | 2011183430 A | 9/2011 |
| KR | 10-2010-0043228 | 4/2010 |
| KR | 10-1738007 | 5/2017 |
| WO | 2007023288 A2 | 3/2007 |
| WO | WO2009011341 | 1/2009 |
| WO | WO2009011392 | 1/2009 |
| WO | 2014057261 A | 4/2014 |

OTHER PUBLICATIONS

Written Opinion, PCT/GB2013/052624, dated Dec. 13, 2013, 6 pages.
International Preliminary Report on Patentability, PCT/GB2013/052624, dated Apr. 14, 2015, 7 pages.
Abstract of JP2000015476; Jan. 18, 2000.
Abstract of JP2003126987; May 8, 2003.
Abstract of JP2011183430; Sep. 22, 2011.
Lu Yuanyuan et al., South China University of Technology Press, "New Material Science and Technology: Metal Roll," Sep. 30, 2012, pp. 918-922.
Zhang, Qiyuan et al., China Machine Press, Brazing Manual, vol. 2, Sep. 30, 2008, pp. 89-90.

* cited by examiner (a)    (b)

(a)    (b)

(a)

(b)

(a)

(b)

(a)

(b)

LEAD-FREE AND ANTIMONY-FREE TIN SOLDER RELIABLE AT HIGH TEMPERATURES

REFERENCE TO RELATED APPLICATIONS

This application is a continuation of U.S. patent application Ser. No. 14/434,470, filed Apr. 9, 2015, which is the U.S. national stage application of International Patent Application No. PCT/GB2013/052624, filed Oct. 9, 2013, and claims the benefit of priority of U.S. Application No. 61/711,277, filed Oct. 9, 2012, the entire disclosures of which are incorporated herein by reference.

FIELD OF THE INVENTION

The present invention relates generally to the field of metallurgy and to an alloy and, in particular, a lead-free and antimony-free solder alloy. The alloy is particularly, though not exclusively, suitable for use in electronic soldering applications such as wave soldering, surface mounting technology, hot air leveling and ball grid arrays, land grid arrays, bottom terminated packages, LEDs and chip scale packages.

BACKGROUND OF THE INVENTION

Wave soldering (or flow soldering) is a widely used method of mass soldering electronic assemblies. It may be used, for example, for through-hole circuit boards, where the board is passed over a wave of molten solder, which laps against the bottom of the board to wet the metal surfaces to be joined.

Another soldering technique involves printing of the solder paste on the soldering pads on the printed circuit boards followed by placement and sending the whole assembly through a reflow oven. During the reflow process, the solder melts and wets the soldering surfaces on the boards as well as the components.

Another soldering process involves immersing printed wiring boards into molten solder in order to coat the copper terminations with a solderable protective layer. This process is known as hot-air leveling.

A ball grid array joint or chip scale package is assembled typically with spheres of solder between two substrates. Arrays of these joints are used to mount chips on circuit boards.

There are a number of requirements for a solder alloy to be suitable for use in wave soldering, hot-air leveling processes and ball grid arrays. First, the alloy must exhibit good wetting characteristics in relation to a variety of substrate materials such as copper, nickel, nickel phosphorus ("electroless nickel"). Such substrates may be coated to improve wetting, for example by using tin alloys, gold or organic coatings (OSP). Good wetting also enhances the ability of the molten solder to flow into a capillary gap, and to climb up the walls of a through-plated hole in a printed wiring board, to thereby achieve good hole filling.

Solder alloys tend to dissolve the substrate and to form an intermetallic compound at the interface with the substrate. For example, tin in the solder alloy may react with the substrate at the interface to form an intermetallic compound (IMC) layer. If the substrate is copper, then a layer of $Cu_6Sn_5$ may be formed. Such a layer typically has a thickness of from a fraction of a micron to a few microns. At the interface between this layer and the copper substrate an IMC of $Cu_3Sn$ may be present. The interface intermetallic layers will tend to grow during aging, particularly where the service is at higher temperatures, and the thicker intermetallic layers, together with any voids that may have developed may further contribute to premature fracture of a stressed joint.

Other important factors are: (i) the presence of intermetallics in the alloy itself, which results in improved mechanical properties; (ii) oxidation resistance, which is important in solder spheres where deterioration during storage or during repeated reflows may cause the soldering performance to become less than ideal; (iii) drossing rate; and (iv) alloy stability. These latter considerations are important for applications where the alloy is held in a tank or bath for long periods of time or where the formed solder joints are subjected to high operating temperatures for long periods of time.

For environmental and health reasons, there is an increasing demand for lead-free and antimony-free replacements for lead- and antimony-containing conventional alloys. Many conventional solder alloys are based around the tin-copper eutectic composition, Sn-0.7 wt. % Cu. For example, the tin-silver-copper system has been embraced by the electronics industry as a lead-free alternative for soldering materials. One particular alloy, the eutectic alloy SnAg3.0Cu0.5, exhibits a superior fatigue life compared to a Sn—Pb solder material while maintaining a relatively low melting point of about 217 to 219° C.

In some fields, such as automotive, high power electronics and energy, including LED lighting, for example, it is desirable for solder alloys to operate at higher temperatures, for example 150° C. or higher. The SnAg3.0Cu0.5 alloy does not perform well at such temperatures.

SUMMARY OF THE INVENTION

The present invention aims to solve at least some of the problems associated with the prior art or to provide a commercially acceptable alternative.

Accordingly, in a first aspect, the present invention provides a lead-free, antimony-free solder alloy comprising:
(a) 10 wt. % or less of silver
(b) 10 wt. % or less of bismuth
(c) 3 wt. % or less of copper
(d) at least one of the following elements
up to 1 wt. % of nickel
up to 1 wt. % of titanium
up to 1 wt. % of cobalt
up to 3.5 wt. % of indium
up to 1 wt. % of zinc
up to 1 wt. % of arsenic
(e) optionally one or more of the following elements
0 to 1 wt. % of manganese
0 to 1 wt. % of chromium
0 to 1 wt. % of germanium
0 to 1 wt. % of iron
0 to 1 wt. % of aluminum
0 to 1 wt. % of phosphorus
0 to 1 wt. % of gold
0 to 1 wt. % of gallium
0 to 1 wt. % of tellurium
0 to 1 wt. % of selenium
0 to 1 wt. % of calcium
0 to 1 wt. % of vanadium
0 to 1 wt. % of molybdenum
0 to 1 wt. % of platinum
0 to 1 wt. % of magnesium
0 to 1 wt. % of rare earths (f) the balance tin, together with any unavoidable impurities.

DETAILED DESCRIPTION OF PREFERRED EMBODIMENTS

Figure 1:
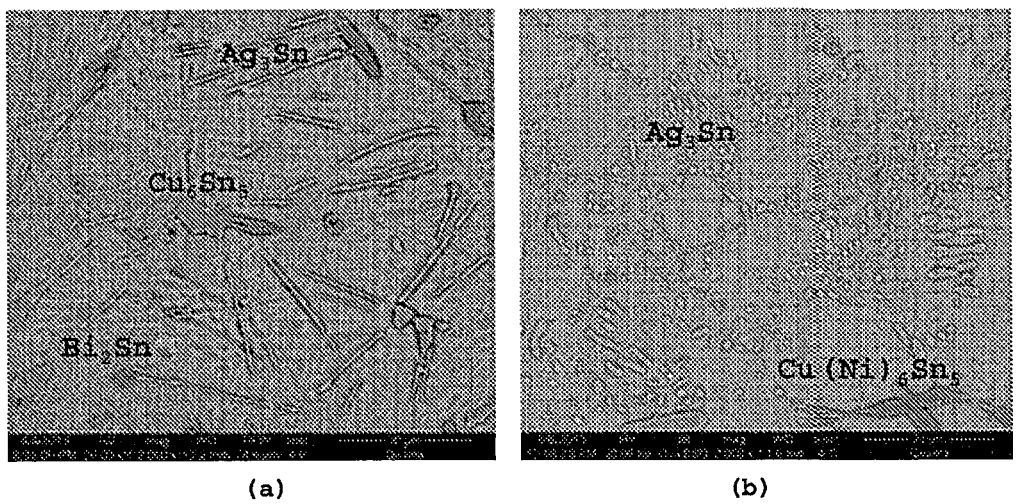
FIG. 1 shows electron microscope images of the microstructure of Alloy A (a) as cast, and (b) after heat treatment at 150° C. Intermetallics compounds were identified by SEM-EDS.

The present invention will now be further described. In the following passages different aspects of the invention are defined in more detail. Each aspect so defined may be combined with any other aspect or aspects unless clearly indicated to the contrary. In particular, any feature indicated as being preferred or advantageous may be combined with any other feature or features indicated as being preferred or advantageous.

The alloys described herein exhibit improved high-temperature reliability and are capable of withstanding operational temperatures of typically at least 150° C. The alloys exhibit improved mechanical properties and high-temperature creep resistance compared to the conventional SnAg3.0Cu0.5 alloy.

The alloys are lead-free and antimony-free meaning that no lead or antimony is added intentionally. Thus, the lead and antimony contents are zero or at no more than accidental impurity levels.

The alloy composition comprises 10 wt. % or less of silver, for example from 1 to 10 wt. %. Preferably, the alloy comprises from 2.5 to 5 wt. % silver, more preferably from 3 to 5 wt. % silver, even more preferably from 3 to 4.5 wt. % silver, and most preferably from 3.5 to 4 wt. % silver. The presence of silver in the specified amount may serve to improve mechanical properties, for example strength, through the formation of intermetallic compounds. In addition, the presence of silver may act to decrease copper dissolution and improve wetting and spread.

The alloy composition comprises 10 wt. % or less of bismuth, for example from 1 to 10 wt. %. Preferably, the alloy comprises from 2 to 6 wt. % bismuth, more preferably from 2.5 to 5 wt. % bismuth, even more preferably from 2.7 to 4.5 wt. % bismuth, and most preferably from 2.8 to 4 wt. % bismuth. The presence of bismuth in the specified amount may serve to improve mechanical properties through solid solution strengthening. Bismuth may also act to improve creep resistance. Bismuth may also improve wetting and spread.

The alloy composition comprises 3 wt. % or less of copper, for example from 0.1 to 3 wt. %. Preferably, the alloy comprises from 0.3 to 2 wt. % copper, more preferably from 0.4 to 1 wt. % copper, even more preferably from 0.5 to 0.9 wt. % copper, and most preferably from 0.6 to 0.8 wt. % copper. The presence of copper in the specified amount may serve to improve mechanical properties, for example strength, through the formation of intermetallic compounds. In addition, the presence of copper reduces copper dissolution and may also improve creep resistance.

The alloy composition optionally comprises 0 to 1 wt. % of nickel, for example from 0.01 to 1 wt. %. If nickel is present, the alloy preferably comprises from 0.03 to 0.6 wt. % nickel, more preferably from 0.05 to 0.5 wt. % nickel, even more preferably from 0.07 to 0.4 wt. % nickel, and most preferably from 0.1 to 0.3 wt. % nickel. The presence of nickel in the specified amount may serve to improve mechanical properties through the formation of intermetallic compounds with tin, which can result in precipitation strengthening. In addition, the presence of nickel may act to reduce the copper dissolution rate. Nickel may also increase drop shock resistance by decreasing IMC growth at the substrate/solder interface.

The alloy composition optionally comprises 0 to 1 wt. % of titanium, for example from 0.005 to 1 wt. %. If titanium is present, the alloy preferably comprises from 0.005 to 0.5 wt. % titanium, more preferably from 0.007 to 0.1 wt. % titanium, even more preferably from 0.008 to 0.06 wt. % titanium, and most preferably 0.01 to 0.05 wt. % titanium. The presence of titanium in the specified amount may serve to improve strength and interfacial reactions. Titanium may also improve drop shock performance.

The alloy composition optionally comprises 0 to 1 wt. % of cobalt, for example from 0.01 to 1 wt. %. If cobalt is present, the alloy preferably comprises from 0.01 to 0.6 wt. % cobalt, more preferably from 0.02 to 0.5 wt. % cobalt, even more preferably from 0.03 to 0.4 wt. % cobalt, and most preferably 0.04 to 0.3 wt. % cobalt. The presence of cobalt may act to lower the copper dissolution rate. Cobalt may also slow the rate of IMC formation at the substrate/solder interface, and increase drop-shock resistance.

The alloy composition optionally comprises 0 to 3.5 wt. % of indium, for example from 0.01 to 3.5 wt. %. If indium is present, the alloy preferably comprises from 0.05 to 3.5 wt. % indium, more preferably from 0.1 to 3.5 wt. % indium. The presence of indium may act to improve mechanical properties through solid solution strengthening.

The alloy composition optionally comprises 0 to 1 wt. % of zinc, for example from 0.01 to 1 wt. %. If zinc is present, the alloy preferably comprises from 0.03 to 0.6 wt. % zinc, more preferably from 0.05 to 0.5 wt. % zinc, even more preferably from 0.07 to 0.4 wt. % zinc, and most preferably 0.1 to 0.3 wt. % zinc. The presence of zinc may act to improve mechanical properties through solid solution strengthening. Zinc may also act to slow IMC growth and reduce void formation.

The alloy composition optionally comprises 0 to 1 wt. % of arsenic, for example from 0.01 to 1 wt. %. If arsenic is present, the alloy preferably comprises from 0.03 to 0.6 wt. % arsenic, more preferably from 0.05 to 0.5 wt. % arsenic, even more preferably from 0.07 to 0.4 wt. % arsenic, and most preferably 0.1 to 0.3 wt. % arsenic. The presence of arsenic may act to improve mechanical properties through particle dispersion.

The alloy may optionally also contain one or more of 0.005 to 1 wt. % of manganese, 0.005 to 1 wt. % of chromium, 0.005 to 1 wt. % of germanium, 0.005 to 1 wt. % of iron, 0.005 to 1 wt. % of aluminum, 0.005 to 1 wt. % of phosphor, 0.005 to 1 wt. % of gold, 0.005 to 1 wt. % of gallium, 0.005 to 1 wt. % of tellurium, 0.005 to 1 wt. % of selenium, 0.005 to 1 wt. % of calcium, 0.005 to 1 wt. % of vanadium, 0.005 to 1 wt. % of molybdenum, 0.005 to 1 wt. % of platinum, 0.005 to 1 wt. % of magnesium and/or 0.005 to 1 wt. % of rare earth element(s).

Rare earths may act to improve spread and wettability. Cerium has been found to be particularly effective in this regard. Aluminium, calcium, gallium, germanium, magnesium, phosphorus and vanadium may act as deoxidizers and may also improve wettability and solder joint strength. Other elemental additions, such as gold, chromium, iron, manganese, molybdenum, platinum, selenium and tellurium may act to improve strength and interfacial reactions.

The term rare earth element as used herein refers to one or more elements selected from Sc, Y, La, Ce, Pr, Nd, Pm, Sm, Eu, Gd, Tb, Dy, Ho, Er, Tm, Yb and Lu.

The alloy will typically comprise at least 88 wt. % tin, more typically at least 90 wt. % tin, still more typically at least 91 wt. % tin.

In a further aspect, there is provided an alloy comprising from 3 to 5 wt. % silver, from 2 to 5 wt. % bismuth, from 0.3 to 1.5 wt. % copper, from 0.05 to 0.4 wt. % nickel, optionally 0.008 to 0.06 wt. % titanium, optionally 0.005 to 0.2 of a rare earth element (preferably cerium), optionally 3 to 4 wt. % of indium, optionally up to 1 wt. % germanium, optionally up to 1 wt. % manganese, optionally 0.01 to 0.1 wt. % cobalt, and the balance tin together with unavoidable impurities.

In one embodiment, there is provided an alloy comprising 3 to 4.5 wt. % silver, 3 to 4.5 wt. % bismuth, 0.5 to 1.5 wt. % copper, 0.05 to 0.25 wt. % nickel, and the balance tin together with unavoidable impurities. Such an alloy has a melting range of from 207.2 to 215.9° C., which is lower than the near eutectic temperature of the conventional SnAg3.0Cu0.5 alloy. Such an alloy has a hardness that is about twice the magnitude of the hardness of SnAg3.0Cu0.5. In one specific example of this embodiment, the alloy comprises approximately 3.63 wt. % silver, 3.92 wt. % bismuth, 0.76 wt. % copper, 0.18 wt. % nickel, and the balance tin together with unavoidable impurities.

In another embodiment, there is provided an alloy comprising 3 to 4.5 wt. % silver, 3 to 4.5 wt. % bismuth, 0.5 to 1.5 wt. % copper, 0.05 to 0.25 wt. % nickel, 0.005 to 0.05 wt. % of a rare earth element, for example cerium, and the balance tin together with unavoidable impurities. Such an alloy has a melting range of from 208.8 to 219.4° C. and a hardness that is about twice the magnitude of the hardness of SnAg3.0Cu0.5. In one specific example of this embodiment, the alloy comprises approximately 3.81 wt. % silver, 3.94 wt. % bismuth, 0.8 wt. % copper, 0.25 wt. % nickel, 0.04 wt. % cerium, and the balance tin together with unavoidable impurities.

In another embodiment, there is provided an alloy comprising 3 to 4.5 wt. % silver, 2 to 4 wt. % bismuth, 0.5 to 1.5 wt. % copper, 0.05 to 0.25 wt. % nickel, 0.005 to 0.05 wt. % titanium, and the balance tin together with unavoidable impurities. Such an alloy has a melting range of from 210.4 to 215.9° C. and a hardness that is about twice the magnitude of the hardness of SnAg3.0Cu0.5. In one specific example of this embodiment, the alloy comprises approximately 3.8 wt. % silver, 2.98 wt. % bismuth, 0.7 wt. % copper, 0.1 wt. % nickel, 0.01 wt. % titanium, and the balance tin together with unavoidable impurities.

In another embodiment, there is provided an alloy comprising 3 to 4.5 wt. % silver, 3 to 5 wt. % bismuth, 0.4 to 1.5 wt. % copper, 0.1 to 0.3 wt. % nickel, 0.01 to 0.2 wt. % of a rare earth element(s) (preferably cerium), and the balance tin together with unavoidable impurities. Such an alloy has a melting range of from 209.0 to 220.4° C. In one specific example of this embodiment, the alloy comprises approximately 3.85 wt. % silver, 3.93 wt. % bismuth, 0.68 wt. % copper, 0.22 wt. % nickel, 0.08 wt. % cerium, and the balance tin together with unavoidable impurities.

In another embodiment, there is provided an alloy comprising 3 to 4.5 wt. % silver, 3 to 5 wt. % bismuth, 0.3 to 1.2 wt. % copper, 0.05 to 0.3 wt. % nickel, 0.01 to 0.1 wt. % of titanium, and the balance tin together with unavoidable impurities. Such an alloy has a melting range of from 209.3 to 220.6° C. In one specific example of this embodiment, the alloy comprises approximately 3.86 wt. % silver, 3.99 wt. % bismuth, 0.63 wt. % copper, 0.16 wt. % nickel, 0.043 wt. % titanium, and the balance tin together with unavoidable impurities.

In another embodiment, there is provided an alloy comprising 3 to 4.5 wt. % silver, 3 to 5 wt. % bismuth, 0.3 to 1.2 wt. % copper, 0.05 to 0.3 wt. % nickel, 0.01 to 0.1 wt. % of cobalt, and the balance tin together with unavoidable impurities. Such an alloy has a melting range of from 209.1 to 216.1° C. In one specific example of this embodiment, the alloy comprises approximately 3.82 wt. % silver, 3.96 wt. % bismuth, 0.6 wt. % copper, 0.16 wt. % nickel, 0.042 wt. % cobalt, and the balance tin together with unavoidable impurities.

In another embodiment, there is provided an alloy comprising 3 to 4.5 wt. % silver, 2 to 4 wt. % bismuth, 0.3 to 1.2 wt. % copper, 0.05 to 0.25 wt. % nickel, 0.001 to 0.01 wt. % of manganese, and the balance tin together with unavoidable impurities. Such an alloy has a melting range of from 209.2 to 216.8° C. In one specific example of this embodiment, the alloy comprises approximately 3.9 wt. % silver, 3 wt. % bismuth, 0.6 wt. % copper, 0.12 wt. % nickel, 0.006 wt. % Mn, and the balance tin together with unavoidable impurities.

In another embodiment, there is provided an alloy comprising 3 to 4.5 wt. % silver, 2 to 4 wt. % bismuth, 0.3 to 1.2 wt. % copper, 0.05 to 0.3 wt. % nickel, 0.001 to 0.01 wt. % of germanium, and the balance tin together with unavoidable impurities. Such an alloy has a melting range of from 208.2 to 218.6° C. In one specific example of this embodiment, the alloy comprises approximately 3.85 wt. % silver, 3.93 wt. % bismuth, 0.63 wt. % copper, 0.15 wt. % nickel, 0.006 wt. % germanium, and the balance tin together with unavoidable impurities.

In another embodiment, there is provided an alloy comprising 4 to 5 wt. % silver, 3 to 5 wt. % bismuth, 0.3 to 1.2 wt. % copper, 0.05 to 0.3 wt. % nickel, 3 to 4 wt. % of indium, and the balance tin together with unavoidable impurities. Such an alloy has a melting range of from 195.6 to 210.7° C. In one specific example of this embodiment, the alloy comprises approximately 4.24 wt. % silver, 3.99 wt. % bismuth, 0.63 wt. % copper, 0.18 wt. % nickel, 3.22 wt. % indium, and the balance tin together with unavoidable impurities.

In another embodiment, there is provided an alloy comprising 3.5 to 5 wt. % silver, 2 to 5 wt. % bismuth, 0.4 to 1.3 wt. % copper, 0.05 to 0.3 wt. % nickel, 0.01 to 0.1 wt. % of cerium, and the balance tin together with unavoidable impurities. Such an alloy has a melting range of from 209.8 to 217.0° C. In one specific example of this embodiment, the alloy comprises approximately 3.91 wt. % silver, 2.9 wt. % bismuth, 0.72 wt. % copper, 0.2 wt. % nickel, 0.04 wt. % cerium, and the balance tin together with unavoidable impurities.

In another embodiment, there is provided an alloy comprising 3.5 to 5 wt. % silver, 2 to 5 wt. % bismuth, 0.3 to 1.2 wt. % copper, 0.05 to 0.3 wt. % nickel, 0.01 to 0.08 wt. % lanthanum, and the balance tin together with unavoidable impurities. Such an alloy has a melting range of from 210.96 to 220.8° C. In one specific example of this embodiment, the alloy comprises approximately 3.87 wt. % silver, 3.02 wt. % bismuth, 0.61 wt. % copper, 0.14 wt. % nickel, 0.038% lanthanum, and the balance tin together with unavoidable impurities.

In another embodiment, there is provided an alloy comprising 3.5 to 5 wt. % silver, 3 to 5 wt. % bismuth, 0.3 to 1.2 wt. % copper, 0.05 to 0.3 wt. % nickel, 0.01 to 0.08 wt. % neodymium, and the balance tin together with unavoidable impurities. Such an alloy has a melting range of from 207.8 to 219.5° C. In one specific example of this embodiment, the alloy comprises approximately 3.86% silver, 3.99% bismuth, 0.64% copper, 0.14% nickel, 0.044% neodymium, and the balance tin together with unavoidable impurities.

In another embodiment, there is provided an alloy comprising 3.5 to 5 wt. % silver, 3 to 5 wt. % bismuth, 0.3 to 1.2 wt. % copper, 0.05 to 0.3 wt. % nickel, 0.01 to 0.08 wt. % cobalt, and the balance tin together with unavoidable impurities. Such an alloy has a melting range of from 209 to 217° C. In one specific example of this embodiment, the alloy comprises approximately 3.94% silver, 3.92% bismuth, 0.7% copper, 0.12% nickel, 0.023% cobalt, and the balance tin together with unavoidable impurities.

It will be appreciated that the alloys described herein may contain unavoidable impurities, although, in total, these are unlikely to exceed 1 wt. % of the composition. Preferably, the alloys contain unavoidable impurities in an amount of not more than 0.5 wt. % of the composition, more preferably not more than 0.3 wt. % of the composition, still more preferably not more than 0.1 wt. % of the composition, still more preferably not more than 0.05 wt. % of the composition, and most preferably not more than 0.02 wt. % of the composition.

The alloys described herein may consist essentially of the recited elements. It will therefore be appreciated that in addition to those elements that are mandatory (i.e. Sn, Ag, Bi, Cu and at least one of Ni, Ti, Co, In, Zn and/or As) other non-specified elements may be present in the composition provided that the essential characteristics of the composition are not materially affected by their presence.

In one embodiment, the alloy exhibits a relatively low melting point, typically from about 195 to about 222° C. (more typically about 209 to about 218° C.). This is advantageous because it enables a reflow peak temperature of from about 230 to about 240° C.

In another embodiment, the alloy exhibits a thermal conductivity and/or an electrical conductivity which is/are higher or equivalent to the conventional SnAg3.0Cu0.5 alloy. This is advantageous in energy-related applications such as, for example, light-emitting diodes (LED), solar and power electronics.

The alloys of the present invention may be in the form of, for example, a bar, a stick, a solid or flux cored wire, a foil or strip, a film, a preform, or a powder or paste (powder plus flux blend), or solder spheres for use in ball grid array joints, or a pre-formed solder piece or a reflowed or solidified solder joint, or pre-applied on any solderable material such as a copper ribbon for photovoltaic applications or a printed circuit board of any type.

In another aspect, the present invention provides a method of forming a solder joint comprising:
providing two or more work pieces to be joined;
(ii) providing a solder alloy as defined in any of claims 1 to 10; and
(iii) heating the solder alloy in the vicinity of the work pieces to be joined.

In another aspect, the present invention provides the use of an alloy, as herein described, in a soldering method. Such soldering methods include, but are not restricted to, wave soldering, Surface Mount Technology (SMT) soldering, die attach soldering, thermal interface soldering, hand soldering, laser and RF induction soldering, and rework soldering, lamination, for example.

The present invention will now be described further with reference to the following non-limiting examples.

Example 1—Alloy A

Alloy A comprises 3.63 wt % silver, 3.92 wt % bismuth, 0.76 wt % copper, 0.18 wt % nickel, and the balance tin together with unavoidable impurities.

A cross-section of this alloy, as cast, reveals a microstructure containing $Bi_2Sn$, $Ag_3Sn$ and $Cu_6Sn_5$ (see FIG. 1(a)). The $Ag_3Sn$ is dispersed in the tin matrix, but also appears as needle-shaped precipitates. Other intermetallics Sn—Bi and Sn—Cu precipitates are non-homogeneously distributed in the matrix. After heat treatment at approximately 150° C. for about 200 hours, significant reduction of needle-shape $Ag_3Sn$ is observed, revealing a more homogeneous microstructure. Also, after the heat-treatment, the microstructure shows a more homogeneous distribution of the precipitates in the Sn-matrix and the presence of Ni, Cu—Sn precipitates (see FIG. 1(b)).

Such a microstructure, i.e. a more homogeneous matrix and the presence of finely distributed intermetallics precipitates, suggests that both solid solution and precipitation hardening are responsible for alloy strengthening and improved mechanical properties. The phenomenon of creep is expected to be reduced by such a microstructure.

Alloy A has a melting range of 207.2 to 215.9° C.; a coefficient of thermal expansion CTE (μm/mK) (30-100° C.) of 19.6; and a Vickers Hardness (HV-1) of 31. For comparison purposes, the conventional alloy, SnAg3.0Cu0.5, has a melting range of 216.6 to 219.7° C.; a coefficient of thermal expansion CTE (μm/mK) (30-100° C.) of 22.4; and a Vickers Hardness (HV-0.5) of 15.

Example 2—Alloy B

Figure 2:
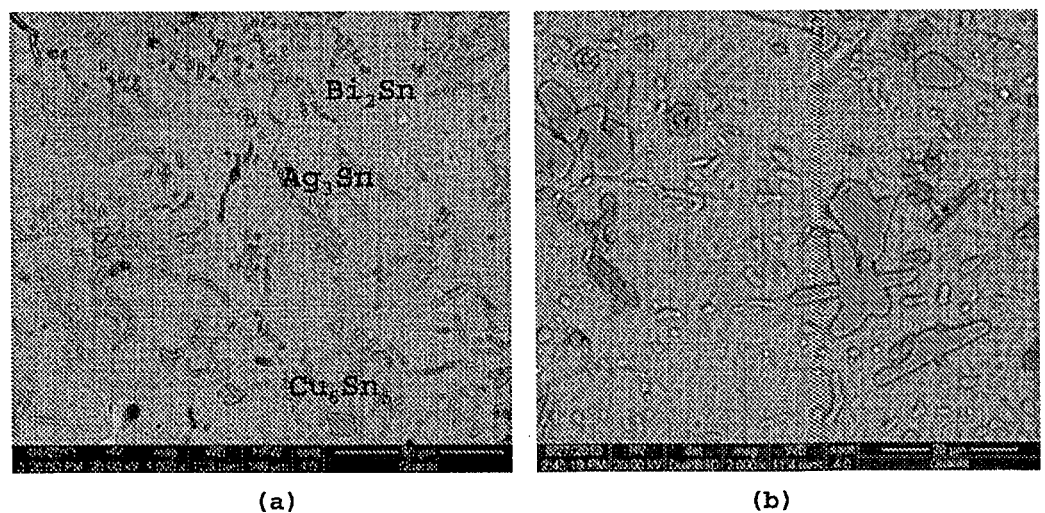
FIG. 2 shows electron microscope images of the microstructure of Alloy B (a) as cast, and (b) after heat treatment at 150° C. Intermetallics compounds were identified by SEM-EDS.

Alloy B comprises 3.81 wt % silver, 3.94 wt % bismuth, 0.8 wt % copper, 0.25 wt % nickel, 0.04 wt % cerium, and the balance tin together with unavoidable impurities. Alloy B also reveals a microstructure containing $Bi_2Sn$, $Ag_3Sn$ and $Cu_6Sn_5$ (see FIG. 2(a)). Similar to Alloy A, $Ag_3Sn$ is dispersed in the Sn matrix, but also appears as needle-shaped precipitates, and Sn—Cu precipitates are non-homogeneously distributed in the matrix. After a heat-treatment at approximately 150° C. for about 200 hours, the eutectic Ag—Sn can clearly be seen and a significant reduction of needle-shaped $Ag_3Sn$ is also observed, showing a more homogeneous microstructure (see FIG. 2(b)). As with Alloy A, Ni, Cu—Sn precipitates are identified in the matrix after the heat-treatment. Such precipitates have been identified by X-ray diffraction analysis as $NiSn_2$ precipitates.

Alloy B has a melting range of 208.8 to 219.4° C.; a coefficient of thermal expansion CTE (μm/mK) (30-100° C.) of 22.8; and a Vickers Hardness (HV-1) of 28.

Example 3—Alloy C

Figure 3:
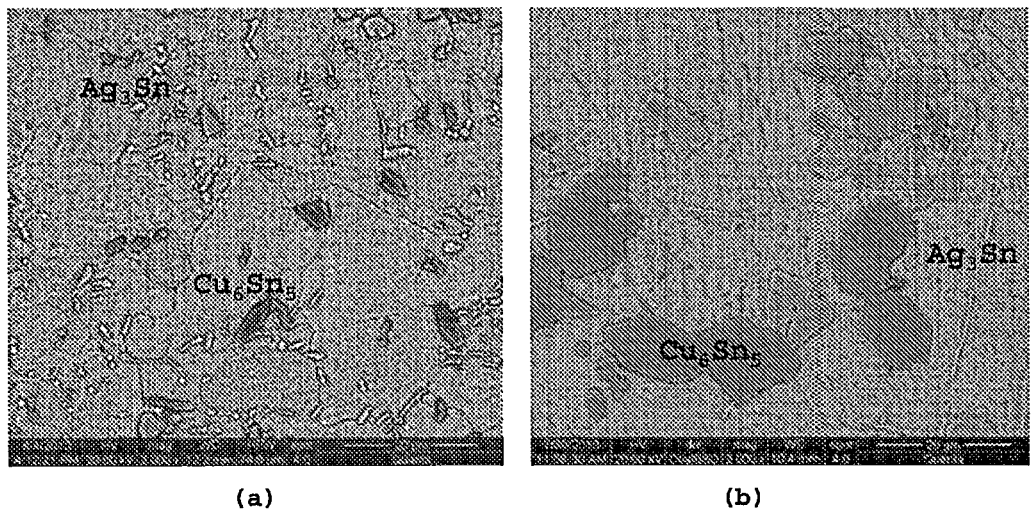
FIG. 3 shows electron microscope images of the microstructure of Alloy C (a) as cast, and (b) after heat treatment at 150° C. Intermetallics compounds were identified by SEM-EDS.

Alloy C comprises 3.8 wt % silver, 2.98 wt % bismuth, 0.7 wt % copper, 0.1 wt % nickel, 0.01 wt % titanium, and the balance tin together with unavoidable impurities. The as cast microstructure (FIG. 3(a)) consists of large concentration of finer $Ag_3Sn$ precipitates dispersed along the grain boundaries, which is expected to prevent grain boundary sliding during creep and thus improving creep resistance of the alloy. Significant growth of the precipitates is observed after aging at 150° C. for about 200 hours (FIG. 3(b)).

Alloy C has a melting range of 210.4 to 215.9° C.; a coefficient of thermal expansion CTE (μm/mK) (30-100° C.) of 23.8; and a Vickers Hardness (HV-1) of 28.

Example 4—Alloy D

Figure 4:
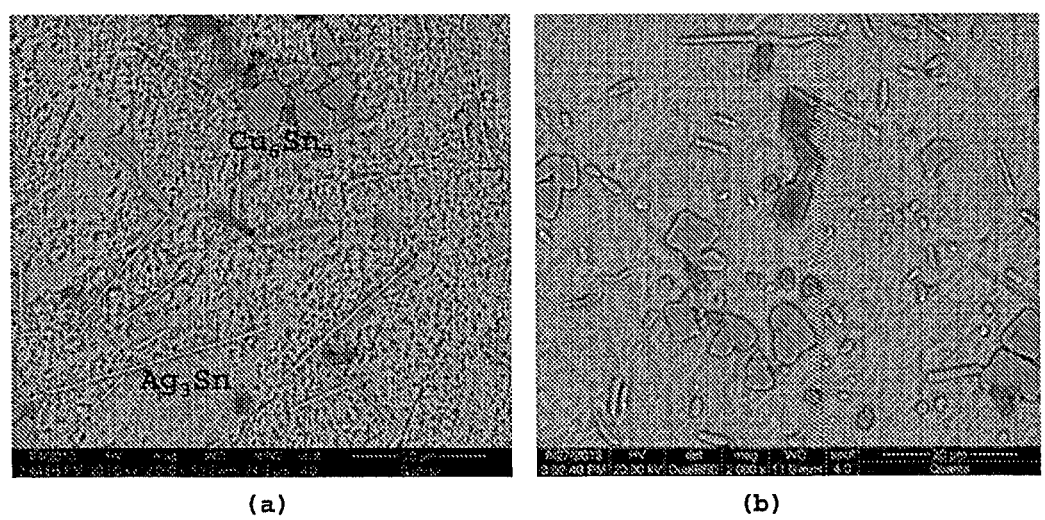
FIG. 4 shows electron microscope images of the microstructure of Alloy D (a) as cast, and (b) after heat treatment at 150° C. Intermetallics compounds were identified by SEM-EDS.

Alloy D comprises 3.85% silver, 3.93% bismuth, 0.68% copper, 0.22% nickel, 0.078% cerium, and the balance tin together with unavoidable impurities. This alloy microstructure (FIG. 4(a)) reveals long needle-shaped $Ag_3Sn$ along with $Cu_6Sn_5$ precipitates.

Alloy D has a melting range of 209.0 to 220.4° C.; a coefficient of thermal expansion CTE (μm/mK) (30-100° C.) of 22; and a Vickers Hardness (HV-1) of 29.

Example 5—Alloy E

Alloy E comprises 3.86% silver, 3.99% bismuth, 0.63% copper, 0.16% nickel, 0.043% titanium, and the balance tin together with unavoidable impurities. It has a melting range of 209.3 to 220.6° C.; and Vickers Hardness (HV-1) of 30.

Example 6—Alloy F

Alloy F comprises 3.82% silver, 3.96% bismuth, 0.6% copper, 0.16% nickel, 0.042% cobalt, and the balance tin together with unavoidable impurities. It has a melting range of 209.1 to 216.1° C.; and a coefficient of thermal expansion CTE (μm/mK) (30-100° C.) of 22.4.

Example 7—Alloy G

Alloy G comprises 3.9% silver, 3% bismuth, 0.6% copper, 0.12% nickel, 0.006% manganese, and the balance tin together with unavoidable impurities. It has a melting range of 209.2 to 216.8° C.; and a Vickers Hardness (HV-1) of 28.

Example 8—Alloy H

Alloy H comprises 3.83% silver, 3.93% bismuth, 0.63% copper, 0.15% nickel, 0.006% germanium, and the balance tin together with unavoidable impurities. It has a melting range of 208.2 to 218.6° C.; a coefficient of thermal expansion CTE (μm/mK) (30-100° C.) of 21.7; and a Vickers Hardness (HV-1) of 29.

Example 9—Alloy I

Alloy I comprises 4.20% silver, 3.99% bismuth, 0.63% copper, 0.18% nickel, 3.22% indium, and the balance tin together with unavoidable impurities. It has a melting range of 195.6 to 210.7° C.

Example 10—Alloy J

Alloy J comprises 3.91% silver, 2.9% bismuth, 0.72% copper, 0.2% nickel, 0.04% cerium, and the balance tin together with unavoidable impurities. It has a melting range of 209.8 to 217.0° C.; a coefficient of thermal expansion CTE (μm/mK) (30-100° C.) of 22.7; and a Vickers Hardness (HV-1) of 27.

Example 11—Alloy K

Alloy K comprises 3.87% silver, 3.02% bismuth, 0.61% copper, 0.14% nickel, 0.038% lanthanum, and the balance tin together with unavoidable impurities. It has a melting range of 210.96 to 220.8° C.; and a Vickers Hardness (HV-1) of 29.

Example 12—Alloy L

Alloy L comprises 3.86% silver, 3.99% bismuth, 0.64% copper, 0.14% nickel, 0.044% neodymium, and the balance tin together with unavoidable impurities. It has a melting range of 207.8 to 219.5° C.; and a Vickers Hardness (HV-1) of 29.

Example 13—Alloy M

Alloy M comprises 3.94% silver, 3.92% bismuth, 0.7% copper, 0.12% nickel, 0.023% cobalt, and the balance tin together with unavoidable impurities. It has a melting range of 209 to 217° C.; and a coefficient of thermal expansion CTE (μm/mK) (30-100° C.) of 22.6.

Table 1 shows the solidus and liquidus temperatures of SnAg3.0Cu0.5 and Alloys A-M. Solidus temperatures are lower than the near eutectic temperature of the conventional SnAg3.0Cu0.5 alloy for all Alloys A-M. Liquidus temperatures of Alloys A-M and conventional SnAg3.0Cu0.5 alloy are nearly the same.

TABLE 1

Solidus Temperatures and Liquidus Temperatures of SnAg3.0Cu0.5 and Alloys A-M.

| Alloys | Solidus Temperature (° C.) | Liquidus Temperature (° C.) |
| --- | --- | --- |
| SnAg3.0Cu0.5 | 216.6 | 219.7 |
| A | 207.2 | 215.9 |
| B | 208.8 | 219.4 |
| C | 210.4 | 215.9 |
| D | 209.0 | 220.4 |
| E | 209.3 | 220.6 |
| F | 209.1 | 216.1 |
| G | 209.2 | 216.8 |
| H | 208.2 | 218.6 |
| I | 195.6 | 210.7 |
| J | 209.8 | 217.0 |

TABLE 1-continued

Solidus Temperatures and Liquidus Temperatures
of SnAg3.0Cu0.5 and Alloys A-M.

| Alloys | Solidus Temperature (° C.) | Liquidus Temperature (° C.) |
|---|---|---|
| K | 211.0 | 220.8 |
| L | 207.8 | 219.5 |
| M | 209.0 | 217.0 |

Figure 5:
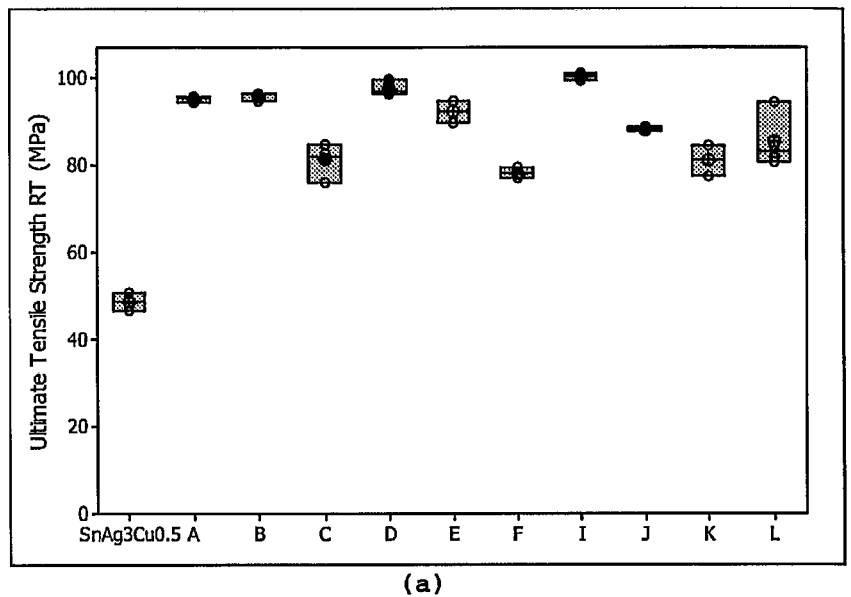
FIG. 5 shows a comparison of (a) ultimate tensile strength, and (b) yield strength at room temperature for SnAg3.0Cu0.5 and alloys according to the present invention.
Figure 5:
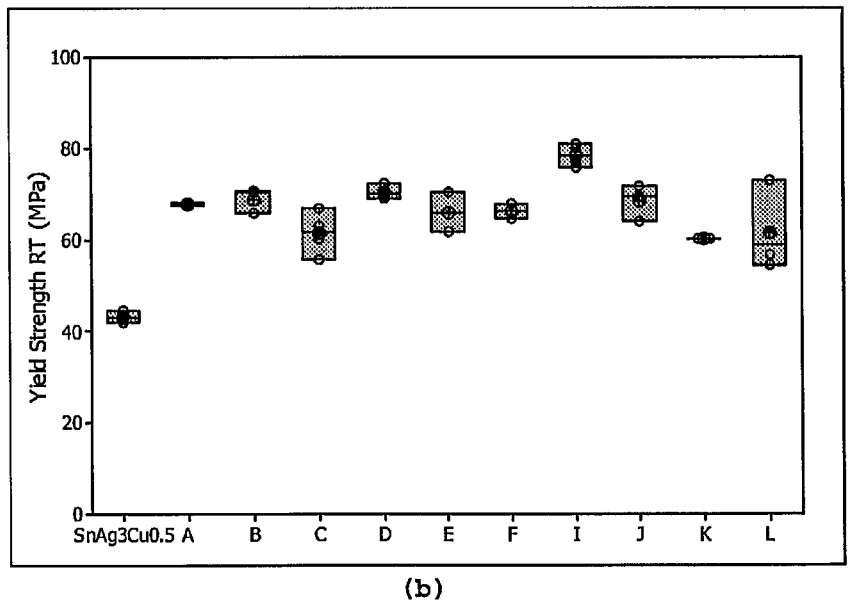

FIG. 5 shows a comparison of (a) ultimate tensile strength, and (b) yield strength at room temperature for SnAg3.0Cu0.5 and alloys according to the present invention (see ASTM E8/E8M-09 for test methods of tensile measurements). The tensile properties at room temperature show a significant improvement. In particular, the ultimate tensile strengths at room temperature for Alloys A, B, C, D, E, F, I, J, K and L are between 60% and 110% higher than that of SnAg3.0Cu0.5. The yield strength shows similar increase in strength of these alloys, showing between 40% and 81% improvement over SnAg3.0Cu0.5.

Figure 6:
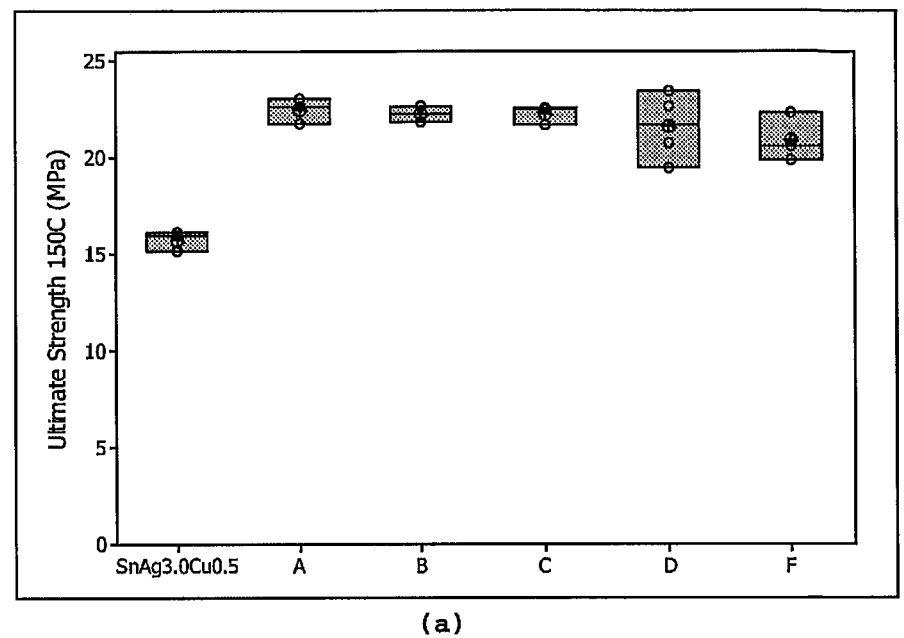
FIG. 6 shows a comparison of (a) ultimate tensile strength, and (b) yield strength at 150° C. for SnAg3.0Cu0.5 and alloys according to the present invention.
Figure 6:
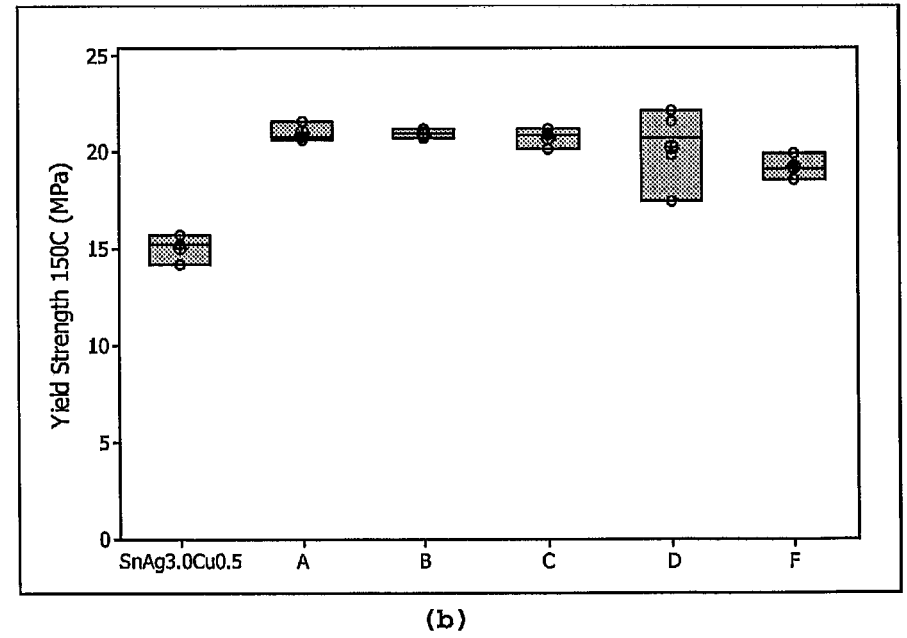

FIG. 6 shows a comparison of (a) ultimate tensile strength, and (b) yield strength at 150° C. for SnAg3.0Cu0.5 and alloys according to the present invention (see ASTM E8/E8M-09 for test methods of tensile measurements). The ultimate tensile strength and yield strength decrease at 150° C. However, the superior properties of Alloys A, B and C over SnAg3.0Cu0.5 remain. Both properties show about 30 to 43% improvement when compared to SnAg3.0Cu0.5.

Testing of the creep properties evaluates the change in deformation (elastic and plastic) over a relatively long time. In the case of high temperature creep, the phenomena of microstructure strengthening alternates with the stress relief caused due to microstructure annealing.

Figure 7:
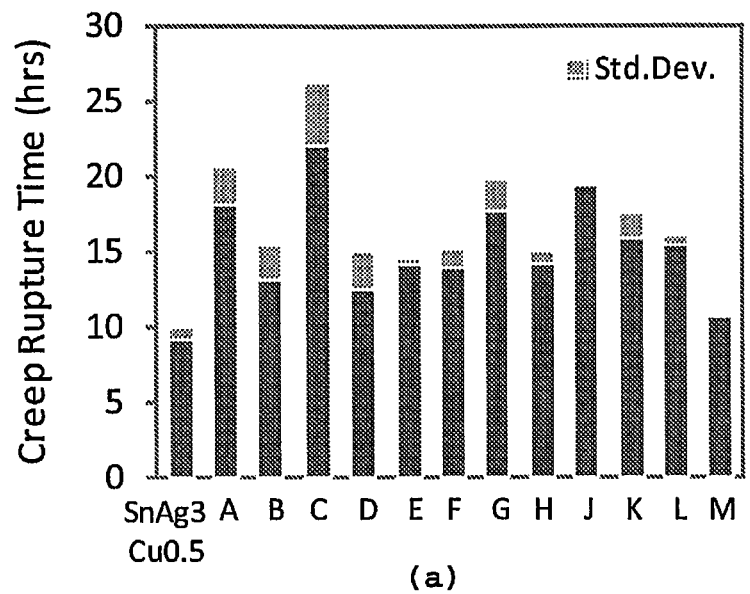
FIG. 7 shows a comparison of (a) creep rupture time and (b) creep elongation at rupture measured at 150° C. of for SnAg3.0Cu0.5 and alloys according to the present invention.
Figure 7:
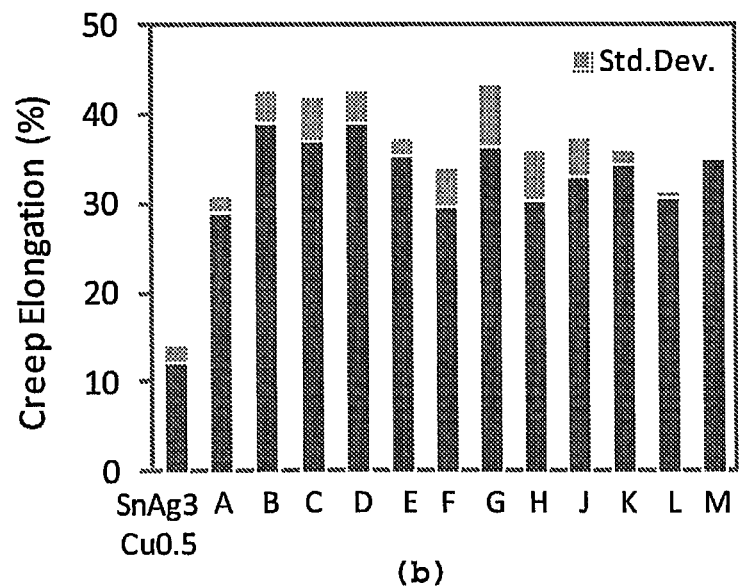

FIG. 7 shows a comparison of (a) creep rupture time and (b) creep elongation at rupture measured at 150° C. of SnAg3.0Cu0.5 and alloys according to the present invention (see ASTM E139 for test methods of creep measurements). The alloys of the present invention have significantly higher creep strength, which is given by the creep rupture time and creep total plastic strain, than SnAg3.0Cu0.5. For example, the creep strength at 150° C. of Alloy C is 141% higher than of SnAg3.0Cu0.5. Similar trend was observed for the creep elongation at rupture, which for Alloy C is 76% than SnAg3.0Cu0.5.

Figure 8:
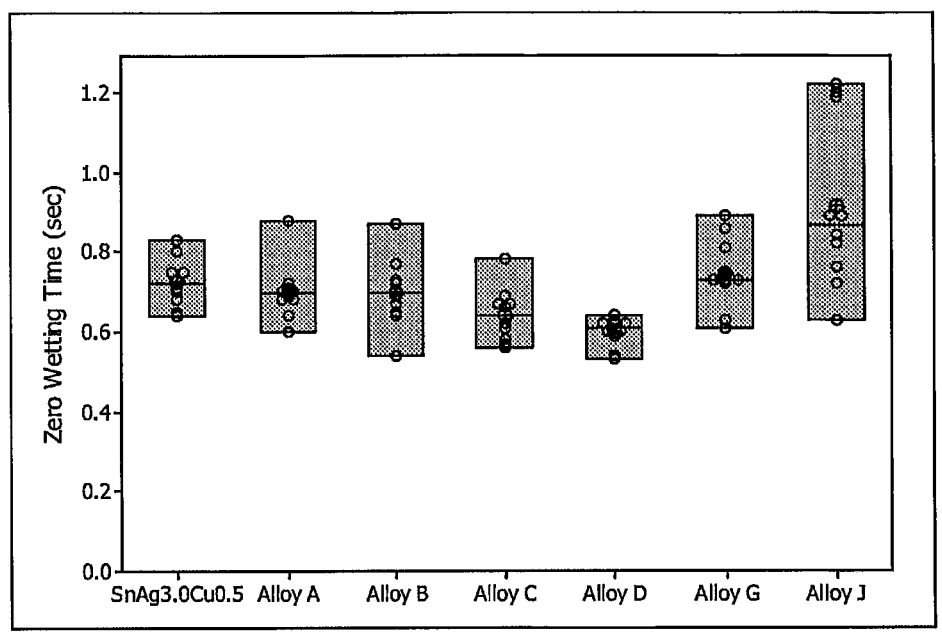
FIG. 8 shows zero wetting time of SnAg3.0Cu0.5 and alloys according to the present invention as a measure of their solderability.

FIG. 8 shows zero wetting time of SnAg3.0Cu0.5 and new alloys as a measure of their solderability and wettability (see JIS Z 3198-4 for test method of wetting balance measurements). Wetting properties of alloys according to the present invention are comparable to conventional SnAg3.0Cu0.5 alloy.

Intermetallics formation due to alloying addition in the alloys according to the present invention resulted in additional strength of the bulk alloy and the solder joint. So far, this has been exemplified here through tensile, hardness and creep measurements. Next, drop shock and thermal cycling performance of the alloys according to the present invention are compared to standard SnAg3.0Cu0.5.

Figure 9:
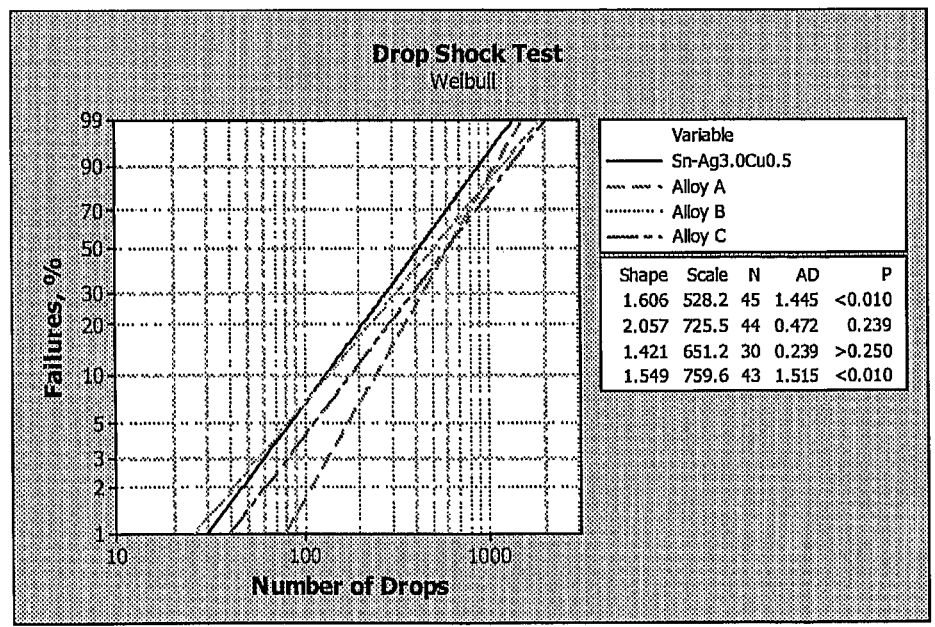
FIG. 9 shows the Weibull distribution curves describing BGA failures during drop shock test.

FIG. 9 shows the Weibull distribution curves describing BGA failures during drop shock test (see JESD22-B111 for test method of drop shock testing). Alloys A, B and C have about 37%, 23% and 44% drop shock improvement of their characteristic life (i.e., at 63% failures level) over SnAg3.0Cu0.5.

Figure 10:
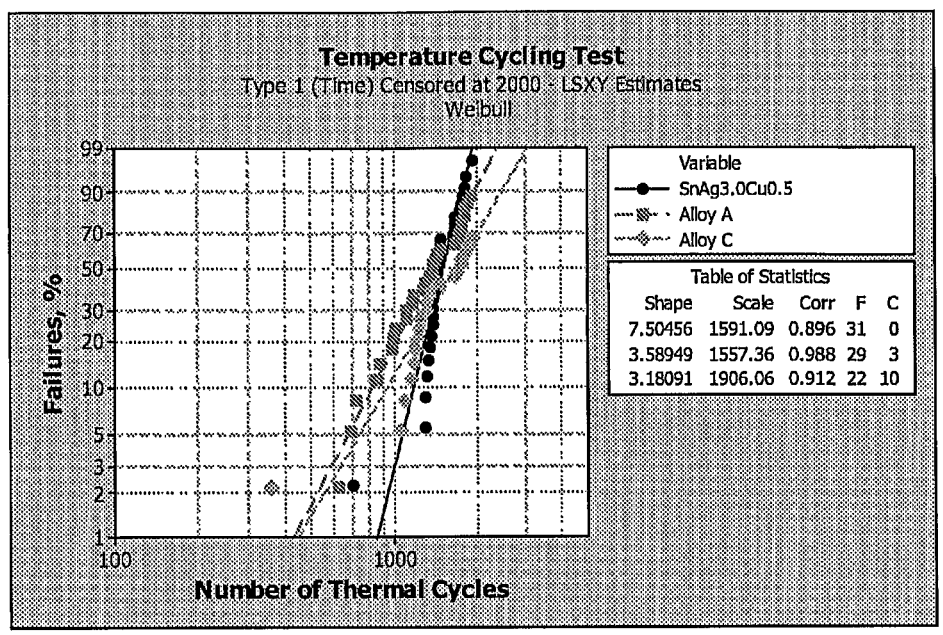
FIG. 10 shows the Weibull distribution curves describing BGA failures during thermal cycling test.

FIG. 10 shows the Weibull distribution curves describing BGA failures during thermal cycling test. Thermal cycle profile used was −40° C. to +150° C. with 30 minutes dwell time at each temperature (see IPC-9701 for test method of thermal cycling measurements). This test was carried out for a total of 2000 cycles to evaluate thermal-mechanical fatigue resistance of the new alloys. The reference alloy is represented by a circle, alloy A by a square and alloy C by a diamond symbol. Before the completion of 2000 cycles, 100% of SnAg3.0Cu0.5 BGA and solder paste assemblies has failed. However, 32% and 40%, respectively, of Alloy A and C BGA and solder paste assemblies have survived the thermal cycling test. Overall, a considerable improvement over SnAg3.0Cu0.5 of the characteristic life (i.e., at 63% failures level) was observed for Alloy C.

Figure 11:
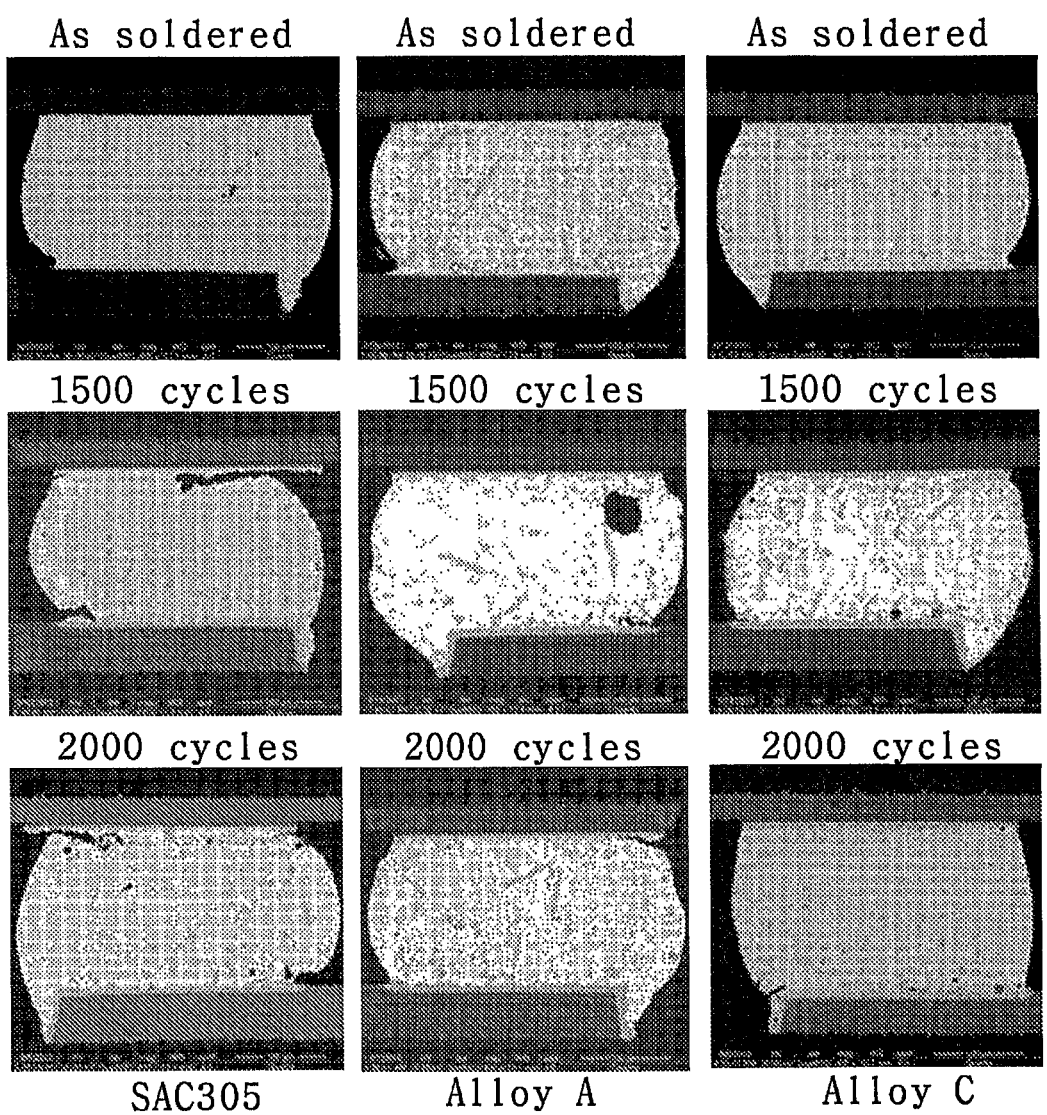
FIG. 11 shows electron microscope images of BGA cross-sections before and after thermal cycling test.

FIG. 11 shows electron microscope images of BGA cross-sections before and after thermal cycling test. Crack initiation in SnAg3.0Cu0.5 was observed after 500 thermal cycles. For the Alloys A and C cracks were observed only after 1000 thermal cycles. After 1500 cycles, extensive cracks were observed in component using SnAg3.0Cu0.5 BGA and solder paste assembly.

Figure 12:
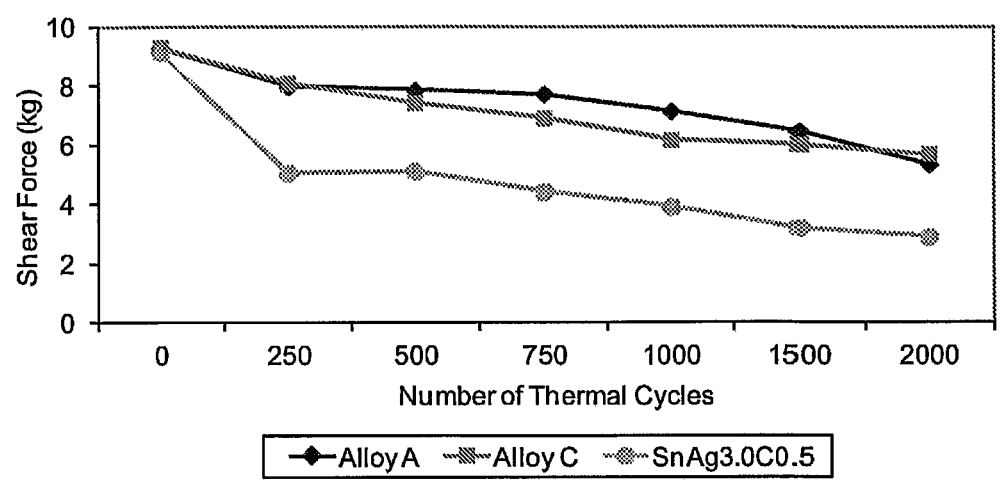
FIG. 12 shows shear force of chip resistors components measured before and after thermal cycling test.

FIG. 12 shows shear force of chip resistors components measured before and after thermal cycling test (see JIS Z3198-7 for test methods of shear force measurements). After 1000 thermal cycles, the force necessary to shear a 1206 chip resistor bonded to the PCB using Alloy A or C is 70% higher than using SnAg3.0Cu0.5 alloy. These results corroborate the superior thermal cycling performance of the new alloys.

Accordingly, the alloy compositions exhibit improved room-temperature and also elevated temperature mechanical properties compared to the conventional alloy, SnAg3.0Cu0.5. These alloy compositions have also demonstrated solderability and wettability comparable to SnAg3.0Cu0.5. Additionally, these alloy compositions have shown improved drop shock resistance and superior thermal-mechanical reliability compared to conventional SnAg3.0Cu0.5 alloy.

The foregoing detailed description has been provided by way of explanation and illustration, and is not intended to limit the scope of the appended claims. Many variations in the presently preferred embodiments illustrated herein will be apparent to one of ordinary skill in the art, and remain within the scope of the appended claims and their equivalents.

The invention claimed is:

1. A lead-free, antimony-free solder alloy consisting of:
   (a) 3 to 4.5 wt. % silver;
   (b) 2.90 to 3.02 wt. % bismuth;
   (c) 0.5 to 1.5 wt. % copper;
   (d) 0.05 to 0.25 wt. % nickel;
   (e) 0.005 to 0.05 wt. % of titanium; and
   (f) the balance tin, together with any unavoidable impurities.

2. The solder alloy according to claim 1, wherein the alloy comprises from 3.5 to 4.0 wt. % silver.

3. The solder alloy according to claim 1, wherein the alloy comprises from 0.5 to 0.9 wt. % copper.

4. The solder alloy according to claim 1, wherein the alloy comprises from 0.008 to 0.05 wt. % titanium.

5. The solder alloy according to claim 1, wherein the alloy has a melting point of from 195 to 222° C.

6. The solder alloy according to claim 1 in the form of a bar, a stick, a solid or flux cored wire, a foil or strip, or a powder or paste, or solder spheres for use in ball grid array joints or chip scale packages, or other pre-formed solder pieces, with or without a flux core or a flux coating.

7. A soldered joint comprising an alloy as defined in claim 1.

8. A method of forming a solder joint comprising:
(i) providing two or more work pieces to be joined;
(ii) providing a solder alloy as defined in claim 1; and
(iii) heating the solder alloy in the vicinity of the work pieces to be joined.

9. A lead-free, antimony-free solder alloy consisting of:
(a) 3.0 to 4.5 wt. % silver;
(b) 3.5 to 5 wt. % bismuth;
(c) 0.3 to 1.2 wt. % copper;
(d) 0.05 to 0.3 wt. % nickel;
(e) 0.01 to 0.6 wt. % cobalt; and
(f) the balance tin, together with any unavoidable impurities.

10. The solder alloy according to claim 9, wherein the alloy comprises from 0.01 to 0.1 wt. % cobalt.

11. A lead-free, antimony-free solder alloy consisting of:
(a) 3.0 to 4.5 wt. % silver;
(b) 2.90 to 3.02 wt. % bismuth;
(c) 0.3 to 1.2 wt. % copper;
(d) 0.05 to 0.25 wt. % nickel;
(e) 0.001 to 1.0 wt. % manganese; and
(f) the balance tin, together with any unavoidable impurities.

12. The solder alloy according to claim 11, wherein the alloy comprises from 0.005 to 0.01 wt. % manganese.

13. The solder alloy according to claim 1, wherein the alloy exhibits a coefficient of thermal expansion of about 23.8 μm/mK.

14. The solder alloy according to claim 1, wherein the alloy exhibits a Vickers Hardness of from about 28 to about 30.

15. The solder alloy according to claim 1, wherein the alloy is exposed to a heat treatment step at approximately 150° C. for about 200 hours.

16. The solder alloy according to claim 9, wherein the alloy comprises 3.5 to 4.0 wt. % silver.

* * * * *